US012378437B2

(12) United States Patent
Izawa

(10) Patent No.: US 12,378,437 B2
(45) Date of Patent: Aug. 5, 2025

(54) POLISHING COMPOSITION, CONCENTRATED LIQUID THEREOF, AND POLISHING METHOD USING THE SAME

(71) Applicant: FUJIMI INCORPORATED, Aichi (JP)

(72) Inventor: Yoshihiro Izawa, Aichi (JP)

(73) Assignee: FUJIMI INCORPORATED, Aichi (JP)

( * ) Notice: Subject to any disclaimer, the term of this patent is extended or adjusted under 35 U.S.C. 154(b) by 878 days.

(21) Appl. No.: 17/407,435

(22) Filed: Aug. 20, 2021

(65) Prior Publication Data

US 2022/0064486 A1    Mar. 3, 2022

(30) Foreign Application Priority Data

Aug. 28, 2020  (JP) .................................. 2020-144486

(51) Int. Cl.
| | | |
|---|---|---|
| *C09G 1/02* | (2006.01) | |
| *C09K 3/14* | (2006.01) | |
| *H01L 21/304* | (2006.01) | |

(52) U.S. Cl.
CPC .............. *C09G 1/02* (2013.01); *C09K 3/1409* (2013.01); *C09K 3/1463* (2013.01); *H01L 21/304* (2013.01)

(58) Field of Classification Search
CPC ...... C09G 1/02; C09K 3/1409; C09K 3/1463; H01L 21/304; H01L 21/31053; C12Q 1/6886; C12Q 2600/112; C12Q 2600/154
See application file for complete search history.

(56) References Cited

U.S. PATENT DOCUMENTS

| | | | | |
|---|---|---|---|---|
| 6,037,260 | A | * | 3/2000 | Tsai ..................... C09K 3/1463 451/36 |
| 2007/0044385 | A1 | | 3/2007 | Yamada |
| 2008/0176075 | A1 | | 7/2008 | Bauer et al. |

FOREIGN PATENT DOCUMENTS

| | | | |
|---|---|---|---|
| JP | 7133109 | A | 5/1995 |
| JP | 2001225273 | A | 8/2001 |
| JP | 2006080406 | A | 3/2006 |
| JP | 2007-063442 | A | 3/2007 |
| JP | 2010515656 | A | 5/2010 |
| JP | 2016-183212 | A | 10/2016 |
| JP | 2000063805 | A | 2/2020 |
| WO | 2010098278 | A1 | 9/2010 |

OTHER PUBLICATIONS

Notice of Reasons for Refusal for JP Application No. 2020-144486, with a mailing date of Apr. 19, 2024.

* cited by examiner

*Primary Examiner* — Shuangyi Abu Ali
(74) *Attorney, Agent, or Firm* — Katten Muchin Rosenman LLP

(57) ABSTRACT

An object of the present invention is to provide a means for reducing the surface roughness (Ra) and suppressing occurrence of scratches while maintaining a high polishing rate in polishing an object to be polished containing a resin. Provided is a polishing composition including particulate alumina and a dispersing medium, in which an α conversion rate of the particulate alumina is 50% or more, and a sphericity of the particulate alumina is 80% or more.

18 Claims, No Drawings

POLISHING COMPOSITION, CONCENTRATED LIQUID THEREOF, AND POLISHING METHOD USING THE SAME

BACKGROUND

1. Technical Field

The present invention relates to a polishing composition, a concentrated liquid thereof, and a polishing method using the same.

2. Description of Related Arts

In recent years, new microfabrication techniques have been developed along with high integration and high performance of LSIs. The chemical mechanical polishing (hereinafter, also abbreviated as "CMP") method is one of them, and is a technique frequently used in the LSI manufacturing process, particularly in the multilayer wiring forming process.

This CMP method is also used for polishing the surface of a resin, and the CMP method is applied so that it is possible to obtain a resin product having few surface defects. As a result, various studies have been made as to polishing compositions for polishing various materials including resins.

JP 2016-183212 A discloses a polishing composition for polishing an object to be polished which contains a resin having high rigidity and high strength. More specifically, the Patent Literature discloses that even the resin having high rigidity and high strength can be polished at a high polishing rate by a polishing composition containing abrasive grains having a Mohs hardness and a surface acid amount equal to or more than a predetermined value and a dispersing medium. Further, from the viewpoint of the polishing rate, the Patent Literature also discloses that the abrasive grains preferably contain α-alumina as a main ingredient.

JP 2007-063442 A (US 2007/0044385 A) discloses a polishing composition for polishing an object to be polished made of a synthetic resin. More specifically, the Patent Literature discloses that a polishing composition containing a specific structure of polyurethane polymeric surfactant and having a predetermined viscosity range is used, whereby it is possible to suppress a decrease of the polishing composition and to suppress a reduction in polishing performance in polishing a synthetic resin. The Patent Literature also discloses that it is preferable that the polishing composition further contains α-alumina as abrasive grains, from the viewpoint of the polishing rate.

SUMMARY

However, according to the techniques described in these patent documents, although a high polishing rate can be obtained, there are problems that surface roughness (Ra) of the resin increases and scratches (grinding scratches) occur on a resin surface, and improvement has been required.

Thus, an object of the present invention is to provide a means for reducing the surface roughness (Ra) and suppressing the occurrence of scratches while maintaining a high polishing rate in polishing an object to be polished containing a resin.

The present inventor has conducted intensive studies in order to solve the above-described problems. As a result, the present inventor has found that the above-described problems can be solved by using alumina having an α conversion rate and a sphericity within a predetermined range as abrasive grains, and has completed the present invention.

That is, the above-described problems of the present invention can be solved by the following means.

A polishing composition including particulate alumina and a dispersing medium, in which an α conversion rate of the particulate alumina is 50% or more, and a sphericity of the particulate alumina is 80% or more.

DETAILED DESCRIPTION

Embodiments of the present invention are described hereinbelow. The present invention is not limited only to the following embodiments.

As used herein, the expression "X to Y" showing a range represents "X or more and Y or less". Unless otherwise indicated, operations and measurements of physical properties and the like are carried out under conditions of room temperature (in a range of 20° C. or more and 25° C. or less) and relative humidity of 40% RH or more and 50% RH or less.

<Polishing Composition>

An embodiment of the present invention relates to a polishing composition including particulate alumina and a dispersing medium, in which an α conversion rate of the particulate alumina is 50% or more, and a sphericity of the particulate alumina is 80% or more. By using the particulate alumina having specific a conversion rate and sphericity as described above as abrasive grains, it is possible to reduce surface roughness (Ra) and suppress occurrence of scratches while maintaining a high polishing rate in polishing an object to be polished containing a resin. Hereinafter, each component contained in the polishing composition according to the present invention will be described in detail.

[Abrasive Grain]

The polishing composition according to the present invention contains particulate alumina as abrasive grains. The abrasive grains mechanically polish the object to be polished and improve the polishing rate.

The α conversion rate of the particulate alumina is essentially 50% or more, preferably 60% or more, more preferably 70% or more, still more preferably 75% or more, and particularly preferably 80% or more (upper limit; 100%). When the α conversion rate is in the above range, the polishing rate for the resin (for example, epoxy resin) increases. This is considered to be because an α phase has high hardness. Conversely, when the α conversion rate is less than 50%, there is a possibility that a desired polishing rate cannot be obtained in polishing of the resin (for example, epoxy resin). The α conversion rate of the particulate alumina is determined by a measurement method described in Examples to be described later.

The sphericity ((average minor axis/average major axis)× 100) of the particulate alumina is essentially 80% or more, preferably 85% or more, and more preferably 90% or more. When the sphericity is in the above range, the surface roughness can be reduced, and the occurrence of scratches can be suppressed. This is presumed to be because there are few angular edged portions of the particulate alumina. Conversely, when the sphericity is less than 80%, the surface roughness and the number of scratches may increase. In addition, even when the sphericity is as high as the above range, a high polishing rate can be maintained contrary to conventional common technical knowledge. That is, according to conventional common technical knowledge, it has been considered that a friction between the particulate alumina and the object to be polished decreases as the sphericity increases, so that the polishing rate significantly decreases. However, according to the study of the present inventor, it has been surprisingly found that an influence of the sphericity on the polishing rate is limited, and a high polishing rate can be maintained even if the sphericity is increased. As a result, the present inventor has found that it is possible to improve both the polishing rate and goodness of the finished surface (reduction in surface roughness and scratches), which are considered to be in a trade-off relationship in conventional common technical knowledge, and has completed the present invention. The upper limit value of the sphericity is not particularly limited, and is preferably 99.9% or less, more preferably 99.5% or less, further preferably 95% or less, still more preferably 90% or less, and particularly preferably 85% or less. Within the above range, production aptitude is further improved. The sphericity of the particulate alumina is determined by a measurement method described in Examples to be described later.

An average particle size (average secondary particle size) of the particulate alumina is not particularly limited, and is preferably 0.01 µm or more, more preferably 0.1 µm or more, still more preferably 0.5 µm or more, and particularly preferably 1 µm or more. Within the above range, the polishing rate is further improved. The average particle size of the particulate alumina is preferably 100 µm or less, more preferably 50 µm or less, still more preferably 20 µm or less, particularly preferably 10 µm or less, and most preferably 5 µm or less. Within the above range, the surface roughness is further reduced, and the occurrence of defects such as scratches is further reduced. A preferred example of the average particle size of the particulate alumina is 0.01 µm or more and 100 µm or less, more preferably 0.1 µm or more and 50 µm or less, still more preferably 0.5 µm or more and 20 µm or less, particularly preferably 0.5 µm or more and 5 µm or less, and most preferably 1 µm or more and 5 µm or less. The average particle size of the particulate alumina is determined by a measurement method described in Examples to be described later.

The values of the α conversion rate, the sphericity, and the average particle size of the particulate alumina are equivalent to those obtained by measuring the particulate alumina as a raw material before preparing a concentrated liquid to be described later, those obtained by measuring the particulate alumina taken out from the prepared concentrated liquid, and those obtained by measuring the particulate alumina taken out from the polishing composition (including the polishing composition prepared by diluting the concentrated liquid).

A concentration (content) of the particulate alumina is not particularly limited, and is preferably 0.01% by mass or more, more preferably 0.1% by mass or more, still more preferably 0.5% by mass or more, particularly preferably 1% by mass or more, and most preferably 1.5% by mass or more, with respect to a total mass of the polishing composition. As the concentration of the particulate alumina increases, the polishing rate further increases. Furthermore, the concentration (content) of the particulate alumina is preferably 25% by mass or less, more preferably 15% by mass or less, -still more preferably 10% by mass or less, particularly preferably 8% by mass or less, and most preferably 6% by mass or less, with respect to the total mass of the polishing composition. Within the above range, the surface roughness is further reduced, and the occurrence of defects such as scratches is further reduced. A preferred example of the concentration (content) of the particulate alumina is 0.01% by mass or more and 25% by mass or less, more preferably 0.1% by mass or more and 15% by mass or less, still more preferably 0.5% by mass or more and 10% by mass or less, particularly preferably 1% by mass or more and 8% by mass or less, and most preferably 1.5% by mass or more and 6% by mass or less. Within the above range, it is possible to further achieve both a high polishing rate and the goodness of the finished surface (reduction in surface roughness and scratches).

The particulate alumina can be easily produced by appropriately referring to a known production method (for example, JP 2017-190267A). Further, as the particulate alumina, a commercially available product may be used.

The colloidal alumina may be used alone or in combination of two or more kinds thereof.

[Dispersing Medium]

The polishing composition according to the present invention contains a dispersing medium. The dispersing medium disperses or dissolves each component.

The dispersing medium preferably contains water. In addition, from the viewpoint of preventing the influence of impurities on other components of the polishing composition, it is preferable to use water having as high purity as possible. Specifically, pure water, ultrapure water, or distilled water from which impurity ions have been removed with an ion exchange resin and then foreign substances have been removed through a filter is preferable. In addition, an organic solvent or the like may be further contained as the dispersing medium for the purpose of controlling the dispersibility and the like of other components of the polishing composition.

[Other Components]

The polishing composition according to the present invention may further contain known components such as abrasive grains other than the above, a pH adjusting agent, a chelating agent, a thickener, an oxidizing agent, a dispersant, a surface protecting agent, a wetting agent, a surfactant, a corrosion inhibitor (rust inhibitor), an antiseptic agent, and an antifungal agent, and a first dispersion stabilizer and a second dispersion stabilizer described in the <Concentrated liquid of polishing composition> section to be described later as long as the effects of the present invention are not impaired. The content of other components may be appropriately set according to the purpose of addition thereof.

<Method of Producing Polishing Composition>

A production method (preparation method) of the polishing composition is not particularly limited, and for example, a production method including stirring and mixing particulate alumina and a dispersing medium (preferably water) can be appropriately adopted. In the production method, other components may be further stirred and mixed.

The polishing composition can also be produced by a production method including stirring and mixing a concentrated liquid of the polishing composition to be described later and the dispersing medium.

When each component is mixed, the temperature is not particularly limited, and is preferably 10° C. to 40° C., and heating may be performed to increase a rate of dissolution. The mixing time is also not particularly limited.

<Concentrated Liquid of Polishing Composition>

From the viewpoint of convenience, cost reduction, and the like, the polishing composition can be produced, distributed, stored, and the like in the form of a concentrated liquid, which may be diluted with a dispersing medium such as water as necessary, and then used for polishing. Thus, according to another embodiment of the present invention, a concentrated liquid of the polishing composition is provided. In the present specification, the concentrated liquid of the polishing composition means a composition in which the concentration (content) of the particulate alumina in the concentrated liquid is 2 to 20 times the concentration (content) of the particulate alumina in the polishing composition on a mass basis. That is, the concentration of the concentrated liquid of the polishing composition according to an embodiment of the present invention is 2 to 20 times the concentration of the polishing composition on a mass basis.

According to a preferred embodiment of the present invention, there is provided a concentrated liquid of a polishing composition in which redispersibility of the particulate alumina as abrasive grains is improved by a specific dispersion stabilizer. That is, a preferred embodiment of the present invention relates to a concentrated liquid of the polishing composition, the dispersing medium contains water, and the concentrated liquid further contains at least one of colloidal alumina having an aspect ratio of more than 5 and 800 or less and at least one phosphorus-containing acid selected from the group consisting of phosphoric acid, phosphoric acid condensates (condensed phosphoric acids) organic phosphoric acids, phosphonic acids, and organic phosphonic acids.

A more preferred embodiment of the present invention relates to a concentrated liquid of the polishing composition, in which the dispersing medium contains water, and further contains colloidal alumina having an aspect ratio of more than 5 and 800 or less, and at least one phosphorus-containing acid selected from the group consisting of phosphoric acid, phosphoric acid condensates, organic phosphoric acids, phosphonic acids, and organic phosphonic acids. In the present specification, the "concentrated liquid of the polishing composition" is also simply referred to as a "concentrated liquid". The concentrated liquid naturally contains particulate alumina having an α conversion rate of 50% or more and a sphericity of 80% or more.

Although the present inventor speculates the mechanism by which the redispersibility of the particulate alumina in the concentrated liquid is improved by a specific dispersion stabilizer as follows, the technical scope of the present invention will not be influenced by whether or not the mechanism based on the assumption is correct.

In a preferred embodiment of the present invention, one kind of component is blended as a dispersion stabilizer in order to improve the redispersibility of the particulate alumina as abrasive grains. In a more preferred embodiment of the present invention, two kinds of components are blended as a dispersion stabilizer in order to further improve the redispersibility of the particulate alumina as abrasive grains. A first dispersion stabilizer is colloidal alumina having an aspect ratio of more than 5 and 800 or less. It is considered that colloidal alumina having an aspect ratio within the above range enters between the particles of the particulate alumina and acts as a spacer to suppress the aggregation of the particulate alumina. As a result, the redispersibility of the concentrated liquid can be improved. A second dispersion stabilizer is at least one phosphorus-containing acid selected from the group consisting of phosphoric acid, phosphoric acid condensates, organic phosphoric acids, phosphonic acids, and organic phosphonic acids. According to the study of the inventor, it has been found that the aggregation of alumina (particulate alumina and colloidal alumina) is remarkably suppressed by adjusting the pH to 2 or more and 4.5 or less using these phosphorus-containing acids. Meanwhile, it has also been confirmed that the aggregation inhibitory effect cannot be obtained when other acids are used. Further, as a result of further studies by the inventor, it has been found that alumina usually has a plus zeta potential in an acidic aqueous solution (in an aqueous solution whose pH is adjusted to 2 to 6 using other acids), but the zeta potential of alumina (particulate alumina and colloidal alumina) is modified (negatively shifted) to minus (−) in an acidic aqueous solution containing the above phosphorus-containing acid. Although the detailed mechanism is unknown, it is speculated that the zeta potential is modified (negatively shifted) to minus (−), causing electrostatic repulsion of alumina and suppressing aggregation. In particular, it is considered that the first dispersion stabilizer is used in combination with the second dispersion stabilizer, whereby electrostatic repulsion occurs between colloidal alumina that have entered between particulate alumina particles and particulate alumina, in addition to interparticle electrostatic repulsion of particulate alumina, and a remarkable aggregation inhibitory effect is exerted. Since the colloidal alumina in the present embodiment has an aspect ratio of more than 5 and 800 or less, a surface area per unit volume is large, and electrostatic repulsion can be effectively exhibited. As a result, the redispersibility of the particulate alumina is significantly improved in the concentrated liquid.

[Abrasive Grain]

The concentration (content) of the particulate alumina in the concentrated liquid is not particularly limited, and is preferably 2% by mass or more, more preferably 5% by mass or more, still more preferably 10% by mass or more, and particularly preferably 15% by mass or more, with respect to a total mass of the concentrated liquid. Furthermore, the concentration (content) of the particulate alumina is preferably 40% by mass or less, more preferably 35% by mass or less, still more preferably 30% by mass or less, and particularly preferably 25% by mass or less, with respect to the total mass of the concentrated liquid. A preferred example of the concentration of the particulate alumina is 2% by mass or more and 40% by mass or less, more preferably 5% by mass or more and 35% by mass or less, still more preferably 10% by mass or more and 30% by mass or less, and particularly preferably 15% by mass or more and 25% by mass or less. Within the above range, the effect of improving the redispersibility of the particulate alumina is more remarkably exhibited.

Other matters related to the particulate alumina have been described in the <Polishing composition> section, and thus the description thereof will be omitted here.

[First Dispersion Stabilizer]

The concentrated liquid according to the present embodiment contains colloidal alumina as the first dispersion stabilizer. Generally, the term "colloidal alumina" refers to a dispersion liquid in which alumina fine particles are colloidally dispersed in water as a dispersing medium, but particularly refers to only the above-described alumina fine particles in the present specification. That is, the physical properties and content of colloidal alumina described below are actually interpreted as the physical properties and content of alumina fine particles. Alumina fine particles contained in colloidal alumina are extremely small and difficult to handle as powder, so that the particles are used as colloidal alumina dispersed in water. In the present specification, from the viewpoint of distinguishing between the particulate alumina as abrasive grains and the alumina fine particles contained in colloidal alumina, the latter is intentionally referred to as "colloidal alumina".

In the present embodiment, the colloidal alumina preferably has an aspect ratio of more than 5 and 800 or less. When the aspect ratio is more than 5, sufficient redispersibility is obtained. This is considered to be because the function as a spacer and electrostatic repulsion work well as described above. When the aspect ratio is 800 or less, an influence on polishing performance is small, and a sufficient polishing rate is obtained. The aspect ratio is more preferably 10 or more and 750 or less, still more preferably 50 or more and 500 or less, and particularly preferably 100 or more and 300 or less.

The average major axis of colloidal alumina is not particularly limited, and is preferably 50 nm or more and 5000 nm or less, more preferably 70 nm or more and 2000 nm or less, and still more preferably 100 nm or more and 1000 nm or less. When the average major axis is within the above range, it is considered that the distance between the particles of the particulate alumina can be appropriately maintained. The average minor axis of colloidal alumina is not particularly limited, and is preferably 0.1 nm or more and 10 nm or less, more preferably 0.2 nm or more and 5 nm or less, and still more preferably 0.5 nm or more and 2 nm or less. It is considered that when the average minor axis is within the above range, the colloidal alumina easily enters between the particles of the particulate alumina.

The ratio of the average particle size of particulate alumina to the average major axis of colloidal alumina (average particle size of particulate alumina/average major axis of colloidal alumina) is preferably 0.5 or more and 50 or less, more preferably 5 or more and 40 or less, and still more preferably 10 or more and 30 or less. When the ratio is within the above range, the colloidal alumina easily enters between the particles of the particulate alumina and the distance between the particles of the particulate alumina can be appropriately maintained. Accordingly, it is considered that the aggregation of the particulate alumina is further suppressed. As a result, the redispersibility of the concentrated liquid can be further improved.

The shape of colloidal alumina is not particularly limited as long as the colloidal alumina has the above aspect ratio. The shape may be rod-like, needle-like, fibrous, or feathery. Among these shapes, the fibrous and feathery shapes are preferable, and the feathery shape is more preferable, from the viewpoint of further exerting the effect of the present embodiment. As used herein, the term "fibrous" means that the aspect ratio is 50 or more. Further, as used herein, the term "feathery" means a state in which 10 or more fibrous colloidal alumina fibers gather to form an aggregate, in an image obtained by measuring the colloidal alumina with a scanning electron microscope (SEM) (product name: SU8000, manufactured by Hitachi High-Tech Corporation.).

The aspect ratio, the average major axis, the average minor axis, and the shape are equivalent to those obtained by measuring the colloidal alumina of the raw material before the concentrated liquid is prepared, those obtained by measuring the colloidal alumina taken out from the prepared concentrated liquid, and those obtained by measuring the colloidal alumina taken out from the polishing composition prepared by diluting the concentrated liquid.

The concentration (content) of the colloidal alumina is not particularly limited, and is preferably 0.01% by mass or more, more preferably 0.1% by mass or more, still more preferably 1% by mass or more, and particularly preferably 3% by mass or more, with respect to the total mass of the concentrated liquid. Within the above range, the effect of improving the redispersibility of the concentrated liquid, which is the effect of the present embodiment, is more remarkably exhibited. Furthermore, the concentration (content) of the colloidal alumina is preferably 20% by mass or less, more preferably 15% by mass or less, still more preferably 10% by mass or less, and particularly preferably 5% by mass or less, with respect to the total mass of the concentrated liquid. Within the above range, a high polishing rate can be exhibited without hindering the polishing performance of the abrasive grains. A preferred example of the concentration of the colloidal alumina is 0.01% by mass or more and 20% by mass or less, more preferably 0.1% by mass or more and 15% by mass or less, still more preferably 1% by mass or more and 10% by mass or less, and particularly preferably 3% by mass or more and 5% by mass or less.

The content of the colloidal alumina with respect to 100 parts by mass of the content of the particulate alumina is not particularly limited, and is preferably 0.1 parts by mass or more and 70 parts by mass or less, more preferably 0.5 parts by mass or more and 50 parts by mass or less, still more preferably 1 part by mass or more and 40 parts by mass or less, and particularly preferably 10 parts by mass or more and 30 parts by mass or less. Within the above range, it is possible to achieve both improvement of the redispersibility of the concentrated liquid and a sufficient polishing rate.

The colloidal alumina can be easily produced by appropriately referring to a known production method (e.g., JP 7-291621 A). Further, as the colloidal alumina, commercially available products as described in Examples to be described later may be used.

Note that only one type of colloidal alumina may be used singly, or two or more types of colloidal alumina may be used in combination.

[Second Dispersion Stabilizer]

The concentrated liquid according to the present embodiment contains, as a second dispersion stabilizer, at least one phosphorus-containing acid selected from the group consisting of phosphoric acid, phosphoric acid condensates, organic phosphoric acids, phosphonic acids, and organic phosphonic acids. As used herein, the term "organic phosphoric acids" refers to an organic compound having at least one phosphate group ($-OP(=O)(OH)_2$), and the term "organic phosphonic acids" refers to an organic compound having at least one phosphonic acid group ($-P(=O)(OH)_2$). Further, as used herein, the "phosphoric acid, phosphoric acid condensates, and organic phosphoric acids" are also simply referred to as "phosphoric acid-based acids", and the "phosphonic acids and organic phosphonic acids" are also simply referred to as "phosphonic acid-based acids". These phosphorus-containing acids have a function of modifying (negatively shifting) the zeta potential of alumina (particulate alumina and colloidal alumina) to minus (−). Then, alumina particles whose zeta potential has become minus (−) repel each other electrostatically, so that aggregation can be suppressed and the redispersibility of the concentrated liquid can be improved.

Specific examples of phosphorus-containing acids include, phosphoric acid (orthophosphoric acid), pyrophosphoric acid, tripolyphosphoric acid, tetrapolyphosphoric acid, hexametaphosphoric acid, methyl acid phosphate, ethyl acid phosphate, ethylene glycol acid phosphate, isopropyl acid phosphate, phytic acid (myo-inositol-1,2,3,4,5,6-hexaphosphate), 1-hydroxyethylidene-1,1-diphosphonic acid (HEDP), nitrilotris(methylenephosphonic acid) (NTMP), ethylenediaminetetra(methylenephosophonic acid) (EDTMP), diethylenetriamine penta(methylenephosphonic acid), ethane-1,1-diphosphonic acid, ethane-1,1,2-triphosphonic acid, ethane-1-hydroxy-1,1-diphosphonic acid, ethane hydroxy-1,1,2-triphosphonic acid, ethane-1,2-dicarboxy-1,2-diphosphonic acid, methanehydroxyphosphonic acid, and the like. Among these phosphorus-containing acids, phosphonic acid-based acids are preferable, organic phosphonic acids are more preferable, and 1-hydroxyethylidene-1,1-diphosphonic acid (HEDP), nitrilotris (methylenephosphonic acid) (NTMP), and ethylenediaminetetra(methylenephosophonic acid) (EDTMP) are still more preferable, from the viewpoint of improving the redispersibility and the balance between polishing rate and etching rate.

Note that only one type of phosphorus-containing acid may be used singly, or two or more types of phosphorus-containing acids may be used in combination.

An amount of the phosphorus-containing acid contained in the concentrated liquid is not particularly limited. According to a preferred example, the concentrated liquid according to the present embodiment does not contain an acid other than the phosphorus-containing acid. In this case, the amount of the phosphorus-containing acid contained in the concentrated liquid is such an amount that the pH of the concentrated liquid is 2 or more and 4.5 or less.

[Dispersing Medium]

The concentrated liquid according to the present embodiment preferably contains water as a dispersing medium.

Other matters related to the dispersing medium have been described in the <Polishing composition> section, and thus the description thereof will be omitted here.

[pH]

In the concentrated liquid according to the present embodiment, the pH is preferably 2 or more and 4.5 or less. When the pH is 2 or more, elution of a metal such as copper is suppressed, and the etching rate is not excessively high. When the pH is 4.5 or less, good redispersibility is obtained. This is considered to be because the zeta potential of alumina is sufficiently modified (negatively shifted) by the phosphorus-containing acid. The pH is more preferably more than 2 and less than 4.0, and still more preferably 2.2 or more and 3 or less. The pH of the concentrated liquid is determined by a measurement method described in Examples to be described later.

[Electrical Conductivity (EC)]

The concentrated liquid according to this embodiment preferably has a specific range of electrical conductivity in order to further improve the redispersibility. Specifically, the electrical conductivity of the concentrated liquid is preferably 1.5 mS/cm or more and 3.0 mS/cm or less, more preferably 1.7 mS/cm or more and 2.5 mS/cm or less, and still more preferably 1.8 mS/cm or more and 2.3 mS/cm or less. When the electrical conductivity is 1.5 mS/cm or more, a sufficient amount of phosphorus-containing acid-derived anions are present in the concentrated liquid. Thus, the zeta potential of alumina can be sufficiently modified (negatively shifted), and the redispersibility can be further improved. When the electrical conductivity is 3.0 mS/cm or less, the amount of ions other than phosphorus-containing acid-derived anions (hereinafter referred to as "other ions") in the concentrated liquid is low. According to the study of the inventor, the presence of other ions (particularly cations such as Na+ and K+) is considered to act in a direction that hinders the modification (negative shifting) of the zeta potential of alumina. Accordingly, the amount of other ions (particularly cations such as Na+ and K+) is reduced, as a result of which the redispersibility can be further improved. The electrical conductivity of the concentrated liquid is determined by the measurement method described in Examples to be described later.

[Method of Producing Concentrated Liquid of Polishing Composition]

A production method (preparation method) of the concentrated liquid of the polishing composition is not particularly limited, and for example, a production method including stirring and mixing particulate alumina, a dispersing medium (preferably water), and a dispersion stabilizer (colloidal alumina, phosphorus-containing acid) as necessary can be appropriately adopted. In the production method, components other than the dispersion stabilizer described in the <Polishing composition> section may be further stirred and mixed.

When each component is mixed, the temperature is not particularly limited, and is preferably 10° C. to 40° C., and heating may be performed to increase a rate of dissolution. The mixing time is also not particularly limited.

[Object to be Polished]

The object to be polished by using the polishing composition according to the present invention is not particularly limited, and any object to be polished in a known CMP step can be appropriately selected.

Si element-containing materials are not particularly limited, and examples thereof include polysilicon, amorphous silicon, single-crystal silicon, n-type doped single-crystal silicon, p-type doped single-crystal silicon, Si-based alloys such as SiGe, silicon oxide ($SiO_2$), BD (black diamond: SiOCH), FSG (fluorosilicate glass), HSQ (hydrogen silsesquioxane), CYCLOTENE, SiLK, MSQ (Methylsilsesquioxane), silicon nitride (SiN), silicon carbonitride (SiCN), and the like.

Here, the silicon oxide is preferably silicon oxide derived from tetraethyl orthosilicate (TEOS).

The resin is not particularly limited, and examples thereof include acrylic resins such as poly(methyl (meth)acrylate), methyl methacrylate-methyl acrylate copolymer, and urethane(meth)acrylate resin; epoxy resins; olefin resins such as ultra-high molecular weight polyethylene (UHPE); phenol resin; polyamide resin (PA); polyimide resin (PI); polyester resins such as polyethylene terephthalate (PET), polybutylene terephthalate (PBT), unsaturated polyester resins; polycarbonate resins (PC); polystyrene resins such as syndiotactic polystyrene (SPS); polynorbornene resins; polybenzbenzoxazole (PBO); polyacetal (POM); modified polyphenylene ether (m-PPE); amorphous polyarylate (PAR); polysulfone (PSF); polyether sulfone (PES); polyphenylene sulfide (PPS); polyetheretherketone (PEEK); polyether imide (PEI); fluororesin; liquid crystal polymer (LCP), and the like. Note that, as used herein, the term "(meth) acrylic acid" refers to acrylic acid or methacrylic acid, and both acrylic acid and methacrylic acid. Similarly, as used herein, the term "(meth) acrylate" refers to acrylate or methacrylate, and both acrylate and methacrylate.

Further, the resin also includes reinforced plastics in which fibers such as glass fiber and carbon fiber are compounded to improve the strength.

Among them, the object to be polished is preferably an object to be polished containing a Si element-containing material or a resin on a polishing surface, and more preferably an object to be polished containing silicon oxide or a resin on a polishing surface. Further, the object to be polished is still more preferably an object to be polished containing a resin on a polishing surface, particularly preferably an object to be polished containing an epoxy resin, a polyimide resin or an acrylic resin on a polishing surface, and most preferably an object to be polished containing an epoxy resin on a polishing surface. When used for polishing an object to be polished containing a resin on a polishing surface, particularly when used for polishing an object to be polished containing an epoxy resin on a polished surface, the polishing rate is improved.

In addition, in the object to be polished containing a resin on a polishing surface, the resin may further include inorganic fillers such as calcium carbonate, magnesium carbonate, barium sulfate, magnesium sulfate, aluminum silicate, titanium oxide, alumina, zinc oxide, silicon dioxide, kaolin, talc, glass beads, sericite activated white earth, bentonite, and aluminum nitride, and organic fillers such as polyester fine particles, polyurethane fine particles, and rubber fine particles, and the like.

These Si element-containing materials or resins can be used singly, or in combination of two or more kinds thereof.

Further, the object to be polished may be an object to be polished containing a material different from the Si element-containing materials or resins on a polishing surface, in addition to the Si element-containing materials or resins. Examples of such materials include copper (Cu), aluminum (Al), tantalum (Ta), tantalum nitride (TaN), titanium (Ti), titanium nitride (TiN), nickel (Ni), ruthenium (Ru), cobalt (Co), tungsten (W), tungsten nitride (WN), and the like. When used for polishing an object to be polished containing these metal materials on a polishing surface, particularly when used for polishing an object to be polished containing copper (Cu) on a polishing surface, it is possible to keep the etching rate low.

<Polishing Method>

Another embodiment of the present invention relates to a polishing method including a step of polishing an object to be polished using the above-described polishing composition (including a polishing composition prepared by diluting a concentrated liquid). Preferred examples of the object to be polished according to the present embodiment are the same as those mentioned in the description of [Object to be polished]. For example, it is preferable to polish an object to be polished containing a resin and a metal on the polished surface. That is, a preferred embodiment of the polishing method according to the present invention includes a step of polishing an object to be polished containing a resin and a metal using the polishing composition or a polishing composition obtained by 2 to 20-fold dilution of the concentrated liquid on a mass basis using a dispersing medium.

When polishing an object to be polished using the polishing composition, the polishing can be performed using a device and conditions used for normal polishing. Examples of general polishing machines include a single-sided polishing machine and a double-sided polishing machine. In the single-sided polishing machine, generally, a holder called "carrier" is used to hold an object to be polished, and while the polishing composition is supplied from above, a surface plate having a polishing pad is pressed against one side of the object to be polished and the surface plate is rotated, as a result of which one side of the object to be polished is polished. In the double-sided polishing machine, generally, a holder called "carrier" is used to hold an object to be polished, and while the polishing composition is supplied from above, a surface plate having a polishing pad is pressed against opposite surfaces of the object to be polished and they are rotated in opposite directions, as a result of which both sides of the object to be polished are polished. At this time, polishing is performed by the physical action of friction between the polishing pad and the polishing composition and the object to be polished, and the chemical action which is given to the object to be polished by the polishing composition. As the polishing pad, a porous material such as non-woven fabric, polyurethane, or suede can be used without particular limitation. Preferably, the polishing pad is processed to cause the polishing composition (polishing solution) to accumulate.

Examples of polishing conditions include a polishing load, a surface plate rotation speed, a carrier rotation speed, a flow rate of the polishing composition, a polishing time, and the like. These polishing conditions are not particularly limited, and for example, the polishing load is preferably 0.1 psi (0.69 kPa) or more and 10 psi (69 kPa) or less, more preferably 0.5 psi (3.5 kPa) or more and 8.0 psi (55 kPa) or less, and still more preferably 1.0 psi (6.9 kPa) or more and 6.0 psi (41 kPa) or less, per unit area of the object to be polished. Generally, the higher the load, the higher the frictional force due to the abrasive grains, and the mechanical processing force is improved, whereby the polishing rate is increased. When the polishing load is within this range, a sufficient polishing rate is exerted, and it is possible to suppress damage to the object to be polished due to a load and defects such as scratches on the surface. The surface plate rotation speed and the carrier rotation speed are preferably in a range of 10 rpm ($0.17s^{-1}$) to 500 rpm ($8.3s^{-1}$). The supply amount of the polishing composition may be any supply amount (flow rate) that covers the entire object to be polished, and may be adjusted according to conditions such as the size of the object to be polished. The method of supplying the polishing composition to the polishing pad is also not particularly limited, and for example, a method of continuously supplying the polishing composition with a pump or the like may be used. Further, the processing time is not particularly limited as long as the desired processing result can be obtained, and the processing time is preferably set to a shorter time due to the high polishing rate.

Further, another aspect of the present invention relates to a method of producing an object to be polished, including polishing the object to be polished by the polishing method described above. Preferred examples of the object to be polished according to this embodiment are similar to those exemplified in the above description of [Object to be polished]. A preferred example includes a method of manufacturing an electronic circuit board, including polishing an object to be polished containing a resin and a metal by the polishing method.

Examples

The present invention is described in more detail with reference to the following Examples and Comparative Examples. However, the technical scope of the present invention is not limited to the following Examples. Note that, unless otherwise indicated, "%" and "parts" refer to "% by mass" and "parts by mass", respectively.

<Method of Measuring Physical Properties>

[α Conversion Rate]

The α conversion rate [%] of particulate alumina (abrasive grains) was calculated according to the following formula, based on the peak height (I25.6) of the α phase (012) plane appeared at a position of 2θ=25.6° and the peak height (I46) of the γ phase appeared at a position of 2θ=46° in the powder X-ray diffraction spectra obtained by using a powder X-ray diffractometer.

$$\alpha \text{conversion rate} = I25.6/(I25.6+I46) \times 100 [\text{unit}:\%] \quad \text{[Equation 1]}$$

[Sphericity]

For particulate alumina (abrasive grains), 100 particles were randomly selected from an image measured with a scanning electron microscope (SEM) (product name: SU8000, manufactured by Hitachi High-Tech Corporation.).

The major axis and minor axis of each of the abrasive grains were measured, and the average major axis and the average minor axis were calculated. Subsequently, the sphericity was calculated according to the following formula using the obtained values of the average major axis and the average minor axis.

$$\text{Sphericity[\%]}=(\text{Average minor axis}[\mu m]/\text{Average major axis}[\mu m])\times 100 \quad [\text{Equation 2}]$$

[Average Particle Size]

Particulate alumina (abrasive grains) was measured using a particle size distribution measuring device (Microtrac MT3000II, manufactured by MicrotracBEL Corp.), and the average particle size (average secondary particle size) was obtained.

[Average Major Axis, Average Minor Axis, Aspect Ratio]

For colloidal alumina (first dispersion stabilizer), 100 samples were randomly selected from an image measured with a scanning electron microscope (SEM) (product name: SU8000, manufactured by Hitachi High-Tech Corporation.). The major axis and minor axis of each of the samples were measured, and the average major axis and the average minor axis were calculated. Subsequently, the aspect ratio of colloidal alumina was calculated according to the following formula using the obtained values of the average major axis and the average minor axis.

$$\text{Aspect ratio}=\text{Average major axis}[\mu m]/\text{Average minor axis}[\mu m] \quad [\text{Equation 3}]$$

[pH]

The pH value of the concentrated liquid (liquid temperature: 25° C.) of the polishing composition was confirmed by a pH meter (HORIBA, Ltd. model number: LAQUA (registered trademark)).

[Electrical Conductivity (EC)]

The electrical conductivity of the concentrated liquid (liquid temperature: 25° C.) of the polishing composition was measured with a desktop electric conductivity meter (manufactured by HORIBA, Ltd. model number: DS-71).

<Preparation of Concentrated Liquid of Polishing Composition>

Examples 1 to 4 and Comparative Examples 1 to 4

The abrasive grains, the first dispersion stabilizer, and the second dispersion stabilizer described in Table 1, a Cu corrosion inhibitor (2.0 mmol of 1H-benzotriazole was added per 1 kg of the concentrated liquid), and an antifungal agent (1.0 g of aqueous solution of 1,2-benzisothiazole-3 (2H)-one (trade name: San-ai bac R-30; manufactured by SAN-AI OIL Co., Ltd.) was added per 1 kg of the concentrated liquid) and water were stirred and mixed to obtain a concentrated liquid of the polishing composition (mixing temperature: about 25° C., mixing time: about 10 minutes).

At this time, an amount of the second dispersion stabilizer added was set to an amount at which the pH of the concentrated liquid was the value shown in Table 1.

Evaluation

[Polishing Rate]

Epoxy resin (manufactured by Standard Test Piece Inc., specific gravity: 1.11) was prepared as the object to be polished. Subsequently, the concentrated liquid of the polishing composition was diluted 10-fold with water on a mass basis to prepare a polishing composition. The substrate was polished by the following polishing machine under polishing conditions using the obtained polishing composition, and the polishing rate of the epoxy resin was evaluated according to the following method.

(Polishing Apparatus and Polishing Conditions)
Polishing machine: small desktop polishing machine (EJ380IN, manufactured by Engis Japan Corporation);
Polishing pad: hard polyurethane pad (IC1000, manufactured by NITTA DuPont Incorporated.);
Platen (plate) rotation speed: 70 [rpm];
Head (carrier) rotation speed: 70 [rpm];
Polishing pressure: 4.0 [psi];
Flow rate of polishing composition: 100 [ml/min]; and
Polishing time: 1 [min].

(Polishing Rate Evaluation Method)

1. The mass of the object to be polished before and after polishing was measured using the electronic balance GH-202 (manufactured by A&D Company, Limited), and the amount of change in mass $\Delta M$ [kg] of the object to be polished before and after polishing was calculated from differences in the mass;

2. The amount of change in volume of the object to be polished $\Delta V$ [m$^3$] was calculated by dividing the amount of change in mass of the object to be polished before and after polishing $\Delta M$ [kg] by the specific gravity of the object to be polished (specific gravity of the material to be polished);

3. The amount of change in thickness $\Delta d$ [m] of the object to be polished before and after polishing can be calculated by dividing the amount of change in volume $\Delta V$ [m$^3$] of the object to be polished by the area S [m$^2$] of the polishing surface of the object to be polished; and 4. The amount of change in thickness $\Delta d$ [m] of the object to be polished before and after polishing was divided by the polishing time t [min], and the unit was further converted to [μm/min]. This value was defined as the polishing rate v [μm/min].

[Etching Rate]

The concentrated liquid of the polishing composition was diluted 10-fold with water on a mass basis to prepare a polishing composition. Subsequently, a copper (Cu)-containing material (size: 32 mm×32 mm×1 mm) was immersed in the polishing composition under the following conditions, and the etching rate was determined from the mass reduction rate before and after the immersion using specific the gravity of copper (8.96). The lower the etching rate, the higher the effect of suppressing copper elution, which is preferable. Note that 1 Å=0.1 nm.

(Etching Conditions)
Slurry amount: 500 mL
Stirring speed: 500 rpm
Etching time: 5 minutes
Slurry temperature: 43° C.

[Surface Roughness (Ra)]

The surface roughness Ra of the object to be polished (epoxy resin) after polishing used for evaluation of the polishing rate was measured using a non-contact surface shape measuring instrument (laser microscope, VK-X200, manufactured by KEYENCE CORPORATION). Note that, the surface roughness Ra is a parameter that indicates the average of amplitude in the height direction of a roughness curve, representing the arithmetic average of surface height of an object to be polished within a fixed visual field. A measurement range by the non-contact surface shape measuring instrument was 285 μm×210 μm.

[Number of Scratches]

The surface of the object to be polished (epoxy resin) after polishing used for evaluation of the polishing rate was measured using a laser microscope (VR-3200, manufactured by KEYENCE CORPORATION). The number of scratches with a size of 0.1×50 μm or more visually confirmed when a visual field size of 1.9×1.4 mm was observed at a magnification of 40 times was calculated as an average value of 10 visual fields.

[Redispersibility]

First, the concentrated liquid of the polishing composition was sufficiently stirred, and the specific gravity of the concentrated liquid in a state where the abrasive grains were uniformly dispersed was measured. The value of specific gravity at this time is defined as X. Next, the concentrated liquid was centrifuged (at 500 rpm for 30 minutes) to precipitate the abrasive grains. Shaking (70 spm (stroke per minute)) was performed using a vertical shaker (KM Shaker; manufactured by IWAKI CO., LTD.) in a state in which the container containing the concentrated liquid after centrifugation was turned upside down, and the specific gravity of the liquid on the top of the container was measured every 30 minutes. Then, the time from the start of shaking until the value of specific gravity returned to X was calculated and evaluated according to the following criteria.

<Evaluation Criteria>

⊙ (Excellent): Within 30 minutes
○ (Good): Within 60 minutes
Δ (Satisfactory): Within 90 minutes
× (Poor): 120 minutes or more.

The results are shown in Table 1.

| | Abrasive grain | | | | | First dispersion stabilizer | | | | |
|---|---|---|---|---|---|---|---|---|---|---|
| | Type | α conversion rate (%) | Sphericity (%) | Average particle size (μm) <A> | Concentration (mass %) | Type | Average major axis (nm) <B> | Average minor axis (nm) | Aspect ratio | Shape |
| Example 1 | A1 | 80 | 90 | 0.8 | 20 | B1 | 125 | 0.8 | 156 | Feathery shape |
| Example 2 | A1 | 80 | 90 | 0.8 | 20 | — | — | — | — | — |
| Example 3 | A1 | 80 | 90 | 0.8 | 20 | — | — | — | — | — |
| Example 4 | A2 | 50 | 80 | 0.8 | 20 | — | — | — | — | — |
| Comparative Example 1 | A3 | 78 | 30 | 0.8 | 20 | B1 | 125 | 0.8 | 156 | Feathery shape |
| Comparative Example 2 | A4 | 50 | 40 | 0.7 | 20 | B1 | 125 | 0.8 | 156 | Feathery shape |
| Comparative Example 3 | A5 | 22 | 60 | 0.5 | 20 | B1 | 125 | 0.8 | 156 | Feathery shape |
| Comparative Example 4 | A6 | 0 | 90 | 0.7 | 20 | B1 | 125 | 0.8 | 156 | Feathery shape |

| | First dispersion stabilizer Concentration (mass %) | Second dispersion stabilizer Type | A/B | Physical property pH (—) | Physical property EC (mS/cm) | Evaluation Polishing rate [Epoxy] (μm/min) | Evaluation Etching rate [Cu] (Å/min) | Evaluation Surface roughness Ra (μm) | Evaluation Number of scratches (number/visual field) | Redispersibility |
|---|---|---|---|---|---|---|---|---|---|---|
| Example 1 | 5.0 | HEDP | 6.4 | 2.4 | 1.9 | 2.7 | 10 | 0.31 | 7 | ⊙ |
| Example 2 | — | HEDP | — | 2.4 | 1.6 | 2.7 | 10 | 0.32 | 7 | ○ |
| Example 3 | — | Nitric acid | — | 2.4 | 1.6 | 2.7 | 10 | 0.32 | 8 | X |
| Example 4 | — | Nitric acid | — | 2.4 | 1.5 | 2.2 | 11 | 0.39 | 9 | X |
| Comparative Example 1 | 5.0 | HEDP | 6.4 | 2.4 | 2.0 | 2.9 | 11 | 0.63 | >20 | ⊙ |
| Comparative Example 2 | 5.0 | HEDP | 5.6 | 2.4 | 2.1 | 2.3 | 12 | 0.57 | >20 | ⊙ |
| Comparative Example 3 | 5.0 | HEDP | 4.0 | 2.4 | 2.1 | 1.2 | 10 | 0.52 | >20 | ⊙ |
| Comparative Example 4 | 5.0 | HEDP | 5.6 | 2.4 | 1.9 | 1.0 | 11 | 0.20 | 5 | ⊙ |

A1: Product name High α AO-502, manufactured by Admatechs
A6: Product name AO-502, manufactured by Admatechs
B1: Product name Aluminazol 200, manufactured by Nissan Chemical Corporation
HEDP: 1-hydroxyethane-1,1-diphosphonic acid As shown in Table 1, it was shown that by using the polishing composition according to the present invention, the surface roughness and the number of scratches could be reduced while maintaining a high polishing rate. In particular, although Example 1 had a higher sphericity than Comparative Example 1, a high polishing rate was obtained contrary to common technical knowledge.

Comparing Examples 1 to 3, it was found that the redispersibility of the concentrated liquid of the polishing composition was improved by containing the second dispersion stabilizer (phosphorus-containing acid). Comparing Examples 1 and 2, it was found that the redispersibility of the concentrated liquid was further improved by containing both the first dispersion stabilizer (colloidal alumina) and the second dispersion stabilizer (phosphorus-containing acid).

This application is based on Japanese Patent Application No. 2020-144486 filed on Aug. 28, 2020, and its disclosure is incorporated herein by reference in its entirety.

What is claimed is:

1. A concentrated liquid for a polishing composition, the concentrated liquid comprising:
    particulate alumina, in which an $\alpha$ conversion rate of the particulate alumina is 50% or more and a sphericity of the particulate alumina is 80% or more, and
    a dispersing medium containing water;
    colloidal alumina having an aspect ratio of more than 5 and 800 or less and exhibiting a feathery shape; and
    at least one phosphorus-containing acid selected from the group consisting of phosphoric acid, phosphoric acid condensates, organic phosphoric acids, phosphonic acids, and organic phosphonic acids.

2. The concentrated liquid according to claim 1, wherein the $\alpha$ conversion rate of the particulate alumina is 75% or more.

3. The concentrated liquid according to claim 1, wherein the sphericity of the particulate alumina is 85% or more.

4. The concentrated liquid according to claim 1, wherein an average particle size of the particulate alumina is 0.5 μm or more and 5 μm or less.

5. The concentrated liquid according to claim 1, wherein an average major axis of the colloidal alumina is 50 nm or more and 5000 nm or less.

6. The concentrated liquid according to claim 1, wherein a ratio of an average particle size of the particulate alumina to an average major axis of the colloidal alumina is 0.5 or more and 50 or less.

7. The concentrated liquid according to claim 1, wherein a content of the colloidal alumina with respect to 100 parts by mass of the content of the particulate alumina is 0.1 parts by mass or more and 70 parts by mass or less.

8. The concentrated liquid according to claim 1, wherein a concentration of the particulate alumina in the concentrated liquid is 2 to 20 times a concentration of the particulate alumina in the polishing composition on a mass basis.

9. A polishing method comprising polishing an object to be polished containing a resin and a metal by using a polishing composition obtained by 2 to 20-fold dilution of the concentrated liquid according to claim 1 on a mass basis using a dispersing medium.

10. A method of manufacturing an electronic circuit board, comprising the polishing method according to claim 9.

11. The concentrated liquid according to claim 1, wherein the electrical conductivity of the concentrated liquid is 1.5 mS/cm or more and 3.0 mS/cm or less.

12. The concentrated liquid according to claim 1, wherein the electrical conductivity of the concentrated liquid is 1.8 mS/cm or more and 2.3 mS/cm or less.

13. The concentrated liquid according to claim 1, wherein the pH of the concentrated liquid is 2 or more and 4.5 or less.

14. The concentrated liquid according to claim 1, wherein the average particle size of the particulate alumina is 0.8 μm or more.

15. The concentrated liquid according to claim 1, wherein the average particle size of the particulate alumina is 1 μm or more and 100 μm or less.

16. The concentrated liquid according to claim 1, wherein the aspect ratio of the colloidal alumina is 100 or more and 300 or less.

17. The concentrated liquid according to claim 1, wherein the phosphorus-containing acid is at least one selected from the group consisting of phosphoric acid (orthophosphoric acid), pyrophosphoric acid, tripolyphosphoric acid, tetrapolyphosphoric acid, hexametaphosphoric acid, methyl acid phosphate, ethyl acid phosphate, ethylene glycol acid phosphate, isopropyl acid phosphate, phytic acid (myo-inositol-1,2,3,4,5,6-hexaphosphate), phosphonic acids, and organic phosphonic acids.

18. The concentrated liquid according to claim 1, wherein the phosphorus-containing acid is at least one selected from the group consisting of 1-hydroxyethylidene-1,1-diphosphonic acid (HEDP), nitrilotris(methylenephosphonic acid) (NTMP), and ethylenediaminetetra (methylenephosophonic acid) (EDTMP).

* * * * *